United States Patent
Dang et al.

(10) Patent No.: US 11,574,835 B2
(45) Date of Patent: *Feb. 7, 2023

(54) THERMOPLASTIC TEMPORARY ADHESIVE FOR SILICON HANDLER WITH INFRA-RED LASER WAFER DE-BONDING

(71) Applicant: INTERNATIONAL BUSINESS MACHINES CORPORATION, Armonk, NY (US)

(72) Inventors: Bing Dang, Chappaqua, NY (US); Jeffrey D. Gelorme, Burlington, CT (US); John U. Knickerbocker, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/670,023

(22) Filed: Oct. 31, 2019

(65) Prior Publication Data

US 2020/0083082 A1    Mar. 12, 2020

Related U.S. Application Data

(63) Continuation of application No. 14/668,534, filed on Mar. 25, 2015, now Pat. No. 10,522,383.

(51) Int. Cl.
| | |
|---|---|
| *H01L 21/683* | (2006.01) |
| *C08G 59/06* | (2006.01) |
| *C09J 163/00* | (2006.01) |
| *C09J 171/00* | (2006.01) |
| *C08L 63/00* | (2006.01) |
| *C08L 71/00* | (2006.01) |
| *H01L 21/02* | (2006.01) |
| *C08K 3/04* | (2006.01) |
| *C09J 9/00* | (2006.01) |

(52) U.S. Cl.
CPC ........ *H01L 21/6835* (2013.01); *C08G 59/063* (2013.01); *C08K 3/04* (2013.01); *C08L 63/00* (2013.01); *C08L 71/00* (2013.01); *C09J 9/00* (2013.01); *C09J 163/00* (2013.01); *C09J 171/00* (2013.01); *H01L 21/02057* (2013.01); *C08G 2650/56* (2013.01); *H01L 2221/6834* (2013.01); *H01L 2221/68318* (2013.01); *H01L 2221/68327* (2013.01); *H01L 2221/68381* (2013.01)

(58) Field of Classification Search
CPC . H01L 2224/8085; C08K 3/0033; C08K 3/04; C08L 63/00
See application file for complete search history.

(56) References Cited

U.S. PATENT DOCUMENTS

| | | | | |
|---|---|---|---|---|
| 5,250,228 A | * | 10/1993 | Baigrie | ............. C08K 3/04 219/541 |
| 6,174,998 B1 | | 1/2001 | Guth et al. | |
| 6,352,815 B1 | * | 3/2002 | Feil | ............. B41C 1/05 430/22 |
| 7,534,498 B2 | | 5/2009 | Noda et al. | |
| 7,883,991 B1 | | 2/2011 | Wu et al. | |
| 8,950,459 B2 | | 2/2015 | George et al. | |
| 10,522,383 B2 | * | 12/2019 | Dang | ............. C09J 163/00 |
| 2004/0186201 A1 | * | 9/2004 | Staffer | ............. C09C 1/56 523/215 |
| 2005/0233546 A1 | | 10/2005 | Oohata et al. | |
| 2005/0233547 A1 | | 10/2005 | Noda et al. | |
| 2008/0092806 A1 | | 4/2008 | West et al. | |
| 2011/0069467 A1 | | 3/2011 | Flaim et al. | |
| 2011/0223420 A1 | | 9/2011 | Ichiroku | |
| 2012/0009371 A1 | | 1/2012 | Pietrantoni et al. | |
| 2012/0045624 A1 | | 2/2012 | Campbell et al. | |
| 2012/0091863 A1 | | 4/2012 | Kitayama et al. | |
| 2012/0318675 A1 | | 12/2012 | Guillet et al. | |
| 2013/0011645 A1 | | 1/2013 | Carney et al. | |
| 2013/0233370 A1 | | 9/2013 | Lee et al. | |
| 2013/0248099 A1 | | 9/2013 | Shimizu et al. | |
| 2014/0057450 A1 | | 2/2014 | Bourbina et al. | |
| 2014/0144593 A1 | | 5/2014 | Dang et al. | |
| 2014/0154868 A1 | | 6/2014 | Sugo et al. | |
| 2014/0291655 A1 | | 10/2014 | Suzuki et al. | |
| 2015/0035173 A1 | | 2/2015 | Dang et al. | |
| 2015/0287495 A1 | | 10/2015 | Lee | |
| 2015/0352834 A1 | | 12/2015 | Zwadlo | |

FOREIGN PATENT DOCUMENTS

| | | |
|---|---|---|
| WO | 2004006296 A2 | 1/2004 |
| WO | 2013008540 A1 | 1/2013 |

OTHER PUBLICATIONS

U.S. Office Action issued in U.S. Appl. No. 15/900,178, dated Aug. 29, 2019, pp. 1-19.
U.S. Office Action issued in U.S. Appl. No. 14/747,670 dated Jul. 31, 2017, pp. 1-18.
U.S. Office Action issued in U.S. Appl. No. 14/747,670 dated Mar. 2, 2017, pp. 1-18.
U.S. Office Action issued in U.S. Appl. No. 14/747,670 dated Sep. 19, 2016, pp. 1-16.
List of IBM Patents or Patent Applications Treated as Related dated Oct. 31, 2019, 2 pages.
U.S. Notice of Allowance issued in U.S. Appl. No. 15/900,178 dated Dec. 30, 2020, pp. 1-10.

* cited by examiner

*Primary Examiner* — Jane L Stanley
(74) *Attorney, Agent, or Firm* — Tutunjian & Bitetto, P.C.; Samuel Waldbaum

(57) ABSTRACT

A bonding material including a phenoxy resin thermoplastic component, and a carbon black filler component. The carbon black filler component is present in an amount greater than 1 wt. %. The carbon black filler converts the phenoxy resin thermoplastic component from a material that transmits infra-red (IR) wavelengths to a material that absorbs a substantial portion of infra-red (IR) wavelengths.

13 Claims, 3 Drawing Sheets

THERMOPLASTIC TEMPORARY ADHESIVE FOR SILICON HANDLER WITH INFRA-RED LASER WAFER DE-BONDING

BACKGROUND

Technical Field

The present disclosure relates to wafer bonding methods, and more specifically, to bonding methods including handler wafer de-bonding.

Description of the Related Art

Temporary wafer bonding/de-bonding is an important technology for implementing the fabrication of semiconductor devices, photovoltaic devices, and electrical devices of micron and nanoscale. Bonding is the act of attaching a device wafer, which is to become a layer in a final electronic device structure, to a substrate or handling wafer so that it can be processed, for example, with wiring, pads, and joining metallurgy. De-bonding is the act of removing the processed device wafer from the substrate or handling wafer so that the processed device wafer may be employed into an electronic device. Some existing approaches for temporary wafer bonding/de-bonding involve the use of an adhesive layer placed directly between the silicon device wafer and the handling wafer. When the processing of the silicon device wafer is complete, the silicon device wafer may be released from the handling wafer by various techniques, such as by exposing the wafer pair to chemical solvents delivered by perforations in the handler, by mechanical peeling from an edge initiation point or by heating the adhesive so that it may loosen to the point where the silicon device wafer may be removed by sheering.

SUMMARY

In one embodiment, a method for forming a semiconductor device is provided that may include forming a thermoplastic polymeric adhesive layer including an infra-red (IR) light wave absorbing filler of carbon black on at least one of a semiconductor containing device substrate and a semiconductor containing handler substrate. The semiconductor containing device substrate may be bonded to the semiconductor containing handler substrate at a bonded interface through the thermoplastic polymeric adhesive layer including the infra-red (IR) light wave absorbing filler of carbon black. Backside processing may be applied to the semiconductor containing device substrate, while the semiconductor containing device substrate is bonded to the semiconductor containing handling substrate. The semiconductor containing device substrate may be de-bonded from the semiconductor containing substrate using an infra-red (IR) laser to ablate at least a portion of the thermoplastic polymeric adhesive layer including an infra-red (IR) light wave absorbing filler of carbon black from the bonded interface of the semiconductor containing device substrate and the semiconductor containing handler substrate.

In another embodiment, the method for forming the semiconductor device may include forming a phenoxy resin adhesive layer including a filler of carbon black on at least one of a silicon containing device substrate and a silicon containing handler substrate. The silicon containing device substrate may be bonded to the silicon containing handler substrate at a bonded interface through the phenoxy resin adhesive layer including the filler of carbon black. Backside processing may be applied to the silicon containing device substrate, while the silicon containing device substrate is bonded to the silicon containing handling substrate. The silicon containing device substrate may be de-bonded from the silicon containing substrate using an infra-red (IR) laser to ablate at least a portion of the phenoxy resin adhesive layer the filler of carbon black from the bonded interface of the silicon containing device substrate and the silicon containing handler substrate.

In yet another aspect of the present disclosure, a bonding adhesive is provided for wafer bonding. In one embodiment, the bonding adhesive comprises a phenoxy resin thermoplastic components, and a carbon black filler component. The carbon black filler component is present in an amount greater than 1 wt. %. The carbon black filler converts the phenoxy resin thermoplastic component from a material that transmits infra-red (IR) wavelengths to a material that absorbs a substantial portion of infra-red (IR) wavelengths.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
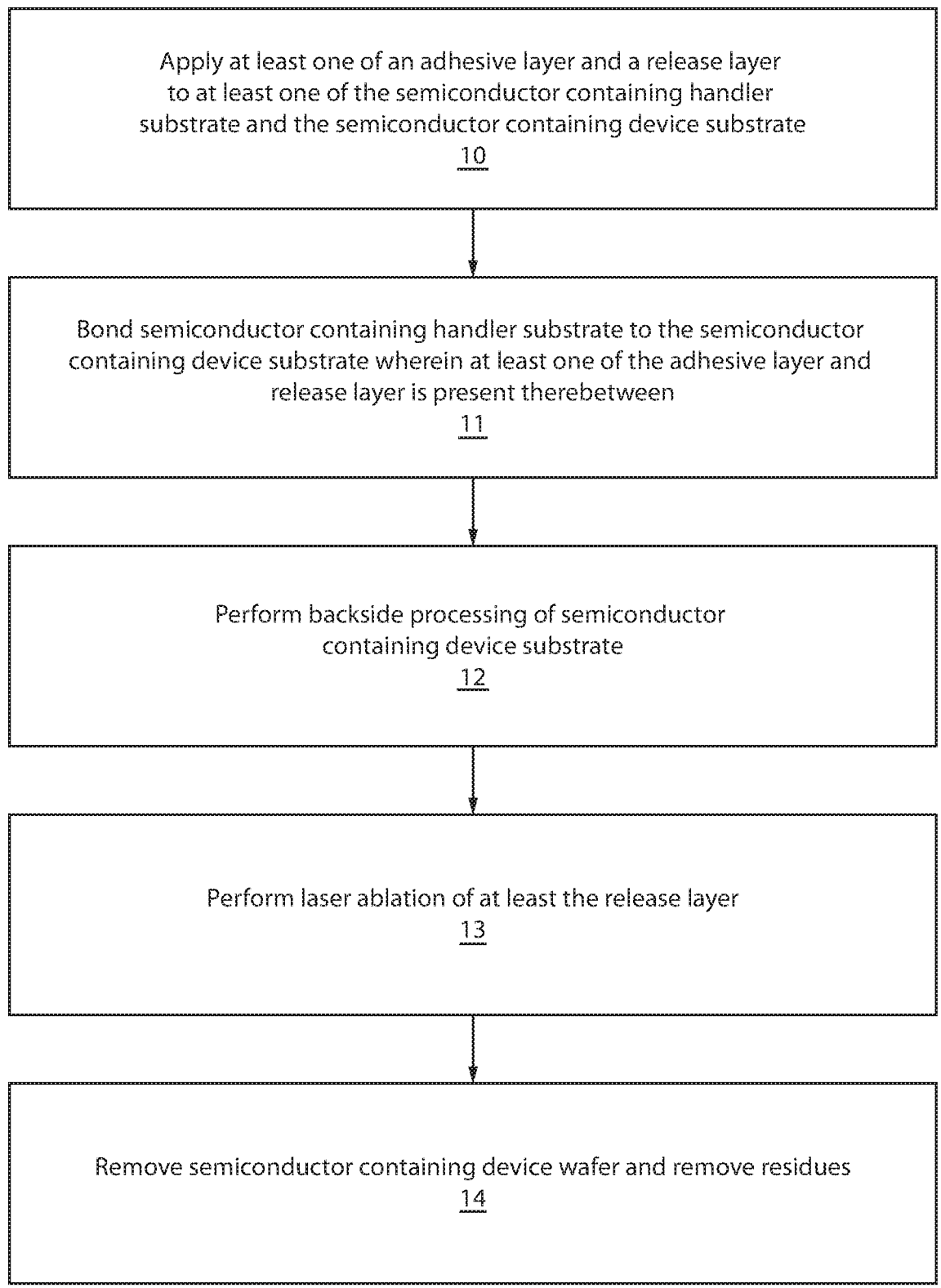
FIG. 1 is a flow chart illustrating an approach for performing semiconductor containing handler substrate bonding and de-bonding in accordance with exemplary embodiments of the present disclosure.

Detailed embodiments of the claimed compositions and methods are disclosed herein; however, it is to be understood that the disclosed embodiments are merely illustrative of the claimed compositions and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

For purposes of the description hereinafter, the terms "upper". "lower", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods, compositions and structures disclosed herein provide low cost, thermoplastic materials that can be used as temporary, and thin semiconductor substrate-to-semiconductor substrate, e.g., silicon wafer to silicon wafer, bonding-and-laser-de-bonding adhesives, in which at least one of the semiconductor substrates can be a handling substrate (also referred to handling wafer). In some embodiments, a "thin" semiconductor substrate is referred to a substrate having a thickness ranging from 1 micron to 100 microns, but in other embodiments the thickness of a thin semiconductor substrate may range from 5 microns to 10 microns. For laser de-bonding, which is one form of de-bonding technology suitable for use with semiconductor and photovoltaic manufacturing, a polyimide material is normally used as the adhesive, along with a deep UV excimer laser to ablate the polyimide adhesive layer, which de-bonds the wafer from the wafer handler. The wafer handler used in accordance with this prior method is typically a coefficient of thermal expansion (CTE) matched glass plate. However, the glass plate has poor thermal conductivity in comparison to silicon (Si). During wafer level test and burn-in, heat dissipation may be a limiting factor for the use of glass plate as a handler material. In addition, glass substrates are not compatible with the standard electrostatic chucking technology in most semiconductor processing equipment.

In accordance with some of the embodiments of the methods, composition and structures that are disclosed herein invention, a silicon wafer handling technology is provided in which the handler substrate (also referred to as handler wafer) may not be a glass plate, but is another semiconductor substrate, e.g., silicon-containing wafer, such as a silicon (Si) wafer. In these embodiments, the de-bonding step for breaking the adhesive bond between the semiconductor substrates may be accomplished with an IR laser and not a deep UV excimer laser. The deep UV (DUV) excimer layer is not suitable for use with some of the embodiments of the methods of the present disclosure, because the light wavelength emitted by a deep UV excimer laser is absorbed by the semiconductor material of the semiconductor containing hander substrate. For example, DUV excimer lasers typically emit a wavelength ranging from in the 150-250 nm range, which are wavelengths typically absorbed by semiconductor substrate materials, such as silicon (Si).

To transmit through the semiconductor material of the semiconductor containing handler substrate, the methods of the present disclosure employ intra-red (IR) lasers. As used herein, an "infra-red (IR) laser" is a laser that emits light having wavelengths ranging from a lower limit with a wavelength on the order of ≈700-800 nm to an upper limit of the visible wavelength range, e.g., approximately 1 mm. Applicants submit that light wavelengths within the infra-red (IR) range are not absorbed by semiconductor materials, such as silicon (Si), which are used in substrates employed in wafer bonding methods, such as handler substrates and device substrates.

For typical glass-to silicon bonding technology, the polyimide that is common for use in the industry as an adhesive is HD3007, a product from HD Microsystems, Inc. It has been determined that one disadvantage of using a polyimide adhesive material as the adhesive in wafer bonding methods in microelectronics device manufacturing is the relatively high processing temperature that is required to convert the polyimide precursor, i.e., polyamic acid, to a fully imidized polyimide before completing bonding of the handling wafer to the device wafer. The temperature range that is typically used to cure the polyimide to provide imidization ranges 300° C. to 400° C. In addition, the nature of a polyimide polymer is usually relatively stiff and rigid such that the polymer requires a high temperature to soften and bond to the handling wafer. The high temperatures required for both steps can do damage to sensitive devices that are included in the device wafer. Further, the high temperatures required for curing the polyimide for imidization and to soften the polyimide for softening can cause stresses in the device wafer that induce warping in the device wafer after cooling. Additionally, in order to remove polyimide residues that remain after de-bonding long soak times in strong hot solvents, such as N-methylpyrrolidone (NMP) and dimethyl sulfoxide (DMSO), may be required.

In addition, in order for HD3007, and similar composition adhesives, to be useful to de-bond from semiconductor containing substrate. e.g., handler wafers composed of silicon (Si), they must be able absorb infra-red (IR) energy from the laser, which is converted to heat, which ablates the adhesive ablates, just as in the case of the UV laser in process flows including a glass handler substrate. It has been determined that HD 3007 does not absorb infra-red (IR) wavelength's, and is therefore not suitable for use in bonding methods that employ semiconductor containing substrates, such as silicon containing substrates.

It has been determined that in order to impart infra-red (IR) absorption to the adhesive material, it is required to add an infra-red (IR) absorbing dye or infra-red (IR) absorbing particles, because most polymers do not absorb wavelengths of light emitted from infra-red (IR) lasers. In addition to absorbing infra-red (IR) energy, the adhesive must ablate easily, and be easy to remove in the areas that have not be exposed to de-bonding laser.

In some embodiments, it has been determined that thermoplastic polymers when filled with carbon black can be useful for adhesion between semiconductor containing substrates, i.e., between a device substrate composed of a silicon containing material and a handler substrate composed of a silicon containing material. More specifically, thermoplastic polymers filled with carbon black easily ablate when exposed to infra-red (IR) energy, i.e., ablated with an infra-red (IR) laser. As will be described in greater detail below, the polymer family suitable for providing the thermoplastic component of the thermoplastic polymer filled with carbon black adhesive may be phenoxy, e.g., phenoxy resin filled with carbon black. For example, the phenoxy resin can have a high molecular weight (MW), and may be a linear polymer of epichlorohydrin and bisphenol A.

In some embodiments, the methods, structures and compositions provided herein provide a set of adhesive resins for use in semiconductor substrate to semiconductor substrate bonding and de-bonding processes that are low cost and have been determined to have good bond/de-bonding performance for adhesives at lower temperatures than polyimides without exhibiting squeeze-out phenomena. In some embodiments, the present disclosure provides a method of adhesive bonding that may include bonding a first semiconductor substrate to a second semiconductor substrate with an adhesive comprising phenoxy resin, wherein the adhesive is cured at a temperature of less than 300° C. The cured phenoxy resin may have a viscosity greater than $1 \times 10^5$ Pa.Sec.

As used herein, the term "phenoxy resin" denotes a family of Bisphenol A/epichlorohydrin linear polymers. Phenoxy resins are typically tough and ductile thermoplastic materials having high cohesive strength and good impact resistance. The backbone ether linkages and pendant hydroxyl groups promote wetting and bonding to polar substrates. Structurally, in some examples, the phenoxy resin may be polyhydroxyether having terminal alpha-glycol groups. In some embodiments, weight-average molecular weights for the phenoxy resins in accordance with the present disclosure may range from approximately 10,000 to above 60.000. In on example, the phenoxy resin may have a molecular weight range of 10,000 g/mole to 50,000 g/mole. The highest polymeric species of phenoxy resin may exceed 250.000 daltons. Olydispersity is very narrow, typically less than 4.0. An average molecule contains 40 or more regularly spaced hydroxyl groups. The phenoxy resin may be a thermoplastic resin suitable for use as an adhesive in low temperature. e.g., less than 300° C. wafer bonding and/or laser de-bonding applications.

In some embodiment of the present disclosure, the phenoxy resin is a Phenoxy Resin PKHC®, PKHH® or PKHJ® having the following formula:

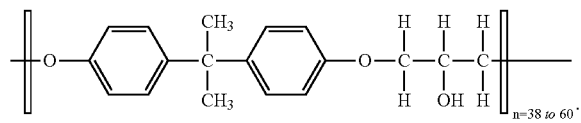

PKHH is available from InChem Corp., in which PKHH phenoxy resin has the IUPAC name: 2-(chloromethyl)oxirane; 4-[2-(4-hydroxyphenyl)propan-2-yl]phenol, and chemical formula $C_{18}H_{21}ClO_3$. PKHJ and PKHC are also available from InChem Corp. PKHH phenoxy resin has a molecular weight of approximately 52,0000 Mw/13,000 Mn (avg.), and has a viscosity ranging from 180-280 cP (Brookfield @ 25° C. 20% in cyclohexanone). PKHJ phenoxy resin may have a molecular weight of approximately 57,0000 Mw/16,000 Mn (avg.), and has a viscosity ranging from 600-775 cP (Brookfield @ 25° C. 20% in cyclohexanone). PKHC phenoxy resin may have a molecular weight of approximately 43,0000 Mw/11,000 Mn (avg.), and has a viscosity ranging from 410-524 cP (Brookfield @ 25° C. 20% in cyclohexanone).

The carbon black used as the filler in the adhesive of thermoplastic polymer provides that infra-red (IR) wavelengths emitted by the infra-red (IR) laser used in the de-bonding process to ablate the adhesive is absorbed by the adhesive. In some embodiments, carbon black (subtypes are acetylene black, channel black, furnace black, lamp black and thermal black) is a material produced by the incomplete combustion of heavy petroleum products, such as FCC tar, coal tar, ethylene cracking tar, and a small amount from vegetable oil. Carbon black is a form of paracrystalline carbon that has a high surface-area-to-volume ratio, albeit lower than that of activated carbon. The thermoplastic polymers, e.g., phenoxy resin, when filled with carbon black can absorb wavelengths ranging from 700 nm to 1 mm consistent with the wavelengths of light emitted from an infra-red (IR) laser, which provides that an adhesive comprised of phenoxy resin filled with carbon black can be ablated from a bonded engagement to semiconductor substrates by an infra-red (IR) laser. Further, in some embodiments in which the release layer 24 is present, because the release layer 24 provides the de-bonding performance, the adhesive layer 23 does not require a composition that can be ablated by an infra-red (IR) laser. Therefore, in this example, not only does the adhesive layer 23 not require the carbon black filler, the adhesive layer 23 may be composed of a different polymer compositions that thermoplastic compositions. The details of the adhesive composition and bonding process in accordance with the methods, compositions and structures of the present are now described in greater detail with reference to FIGS. 1 to 4.

Figure 2:
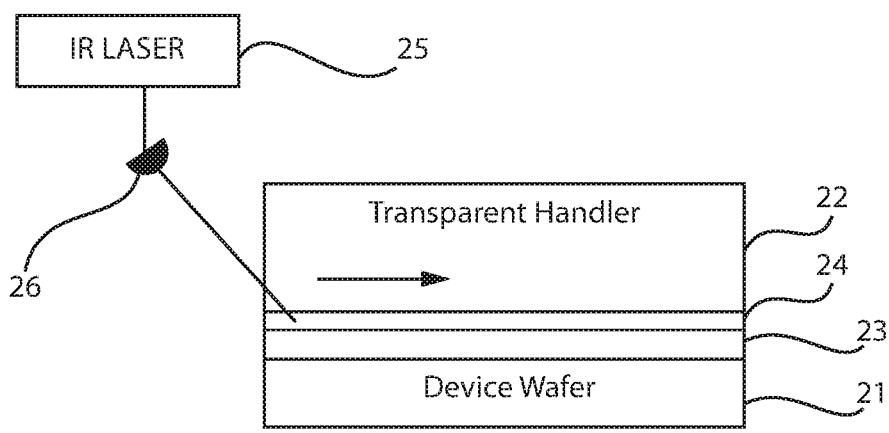
FIG. 2 is a schematic diagram illustrating bonding and de-bonding of a semiconductor containing device substrate to a silicon containing handler substrate, in accordance with exemplary embodiments of the present disclosure.

FIG. 1 is a flow chart illustrating an approach for performing handler substrate bonding and de-bonding in accordance with exemplary embodiments of the present disclosure. Referring to FIGS. 1 and 2, the adhesive layer 23 may be applied to at least one of the semiconductor containing handler substrate 21 and the semiconductor containing device substrate 22 at step 10. The adhesive layer 23 is typically composed of a thermoplastic resin, e.g., phenoxy resin, in which a filler material of carbon black within the thermoplastic resin may be incorporated as an additive to increase absorption of light having wavelengths within the infra-red (IR) range, such as the wavelengths of light emitted from infra-red (IR) lasers.

In one embodiment, an adhesive layer 23 may be applied to one of the semiconductor containing handler substrate 22, and the semiconductor containing device substrate 21, and a release layer 24 may be applied to the other of the semiconductor containing handler substrate 21 and the semiconductor containing device substrate 22. In this example, both the adhesive layer 23 and the release layer 24 may be composed of an adhesive of a thermoplastic resin. The carbon black filler content in the adhesive layer 23 and the release layer 24 may be the same, or the amount of the carbon black filler in the adhesive layer 23 may be less than the amount of carbon black filler in the release layer 24. In some examples, the adhesive layer 23 of thermoplastic resin, e.g., phenoxy resin, may be free of carbon black filler.

Referring to FIGS. 1 and 2, in some embodiments, the device substrate 21 may be provided by a bulk semiconductor substrate. The bulk semiconductor substrate may have a single crystal, i.e., monocrystalline, crystal structure. In some embodiments, the device substrate 21 is composed of a silicon including material, such as silicon (Si). In some embodiments, the silicon including material that provides the device substrate 21 may include, but is not limited to silicon, single crystal silicon, multi-crystalline silicon, polycrystalline silicon, amorphous silicon, strained silicon, silicon doped with carbon (Si:C), silicon alloys or any combination thereof. In other embodiments, the device substrate 21 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The thickness of the device substrate 21 may range from 5 microns to a few millimeters. In some examples, the thickness of the device substrate 21 may range from 5 microns to 10 microns.

The semiconductor containing device substrate 21 may include at least one semiconductor device. As used herein. "semiconductor device" refers to an intrinsic semiconductor material that has been doped, that is, into which a doping agent has been introduced, giving it different electrical properties than the intrinsic semiconductor. In some embodiments, the semiconductor devices that are incorporated into the device substrate 21 are field effect transistors (FETs). A field effect transistor (FET) is a transistor in which output current, i.e., source-drain current, is controlled by the voltage applied to the gate. A field effect transistor typically has three terminals. i.e., gate, source and drain. The semiconductor devices that may incorporated into the semiconductor containing device substrate 21 may be planar semiconductor devices. FinFETS. Trigate semiconductor devices, nanowire semiconductor devices or a combination thereof. The semiconductor devices present in the semiconductor containing device substrate 21 may also include memory devices, e.g., flash memory or eDRAM memory.

The semiconductor containing handler substrate 22 may also be composed of a semiconductor material. For example, the semiconductor containing handler substrate 22 may be composed of a silicon including material, such as silicon (Si). In some embodiments, the silicon including material that provides the semiconductor containing handler substrate 22 may include, but is not limited to silicon, single crystal silicon, multi-crystalline silicon, polycrystalline silicon, amorphous silicon, strained silicon, silicon doped with carbon (Si:C), silicon alloys or any combination thereof. In other embodiments, the semiconductor containing handler substrate 22 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The thickness of the semiconductor containing handler substrate 22 may range from 5 microns to a few millimeters. In some embodiments, the thickness of the semiconductor containing handler substrate 22 may range from 1 micron to 20 microns. In some examples, the thickness of the semiconductor containing handler substrate 22 may range from 5 microns to 10 microns.

In one example, the semiconductor containing handler substrate 22 may be a glass substrate.

As noted above, the adhesive layer 23 and the release layer 24 are applied to at least one of the semiconductor containing device substrate 21 and the semiconductor containing handler substrate 22. The release layer 24 may be optional. Each of the adhesive layer 23 and the release layer 24 may be composed of a thermoplastic resin, such as phenoxy resin, and each of the adhesive layer 23 and the release layer 24 may include carbon black filler. The adhesive layer 23 and the release layer 24 may have the same amount of carbon black filler present therein, or the release layer 24 may have a greater concentration of carbon black filler than the adhesive layer 23. In each of the embodiments that are disclosed herein, whether there is only an adhesive layer 23 that provides both the adhesion and de-bonding performance between semiconductor containing substrates, or an adhesive layer 23 in combination with a release layer 24, at least one of the material layers at the bonding interface between the semiconductor containing device substrate 21 and the semiconductor containing handler substrate 22 includes carbon black filler, in which the carbon black filler absorbs infra-red (IR) wavelengths to ablate the thermoplastic material, e.g., phenoxy resin, during the de-bonding process.

The adhesive layer 23 and/or release layer 24 may be composed of infra-red (IR) absorbing adhesive material, which can be provided by a thermoplastic polymeric adhesive filled with carbon black, wherein the carbon black introduces absorption properties to the thermoplastic polymer. In some embodiments, the thermoplastic component of the adhesive layer 23 and/or release layer 24 may be provided with a phenoxy resin. The adhesive layer 23 and/or release layer 24 may be composed of any of the phenoxy resin compositions that have been described above including, but not limited to. Phenoxy Resin PKHC®. PKHH® or PKHJ® available from InChem Corp. In one example, the adhesive layer 23 and/or release layer 24 may be a phenoxy resin having the chemical name: polyoxy(2-hydroxy-1,3propanediyl)oxy-1,4-phenylene(1-methylethylidene)-1,4-phenylene.

The carbon black that is integrated into the adhesive layer 23 and/or release layer 24 as a filler to the thermoplastic component of the resin, e.g., phenoxy resin, introduces infra-red (IR) light wave adsorption properties to the adhesive layer 23 and/or release layer 24. In some embodiments, carbon black can result from the incomplete combustion of carbon-containing materials, such as oil, fuel oils or gasoline, coal, paper, rubber, plastics and waste material. Carbon black typically contains greater than 97% elemental carbon arranged as aciniform (grape-like cluster) particulate.

Carbon black may be composed of nodules. i.e., particles, having a diameter ranging from 15 nm to 300 nm. In other embodiments, the carbon black may be composed of aggregates. In some embodiments, the near spherical nodules coalesce into particle aggregates that become the basic indivisible entities of carbon black. Aggregates are composed of nodules that interact to provide structures having a greatest dimension ranging from 85 nm to 500 nm. Strong electrical forces maintain the bond between aggregates and promote the formation of agglomerates, which are the result of hundreds to thousands of strongly adhering aggregates. In one embodiment, carbon black agglomerates may have a maximum dimension ranging from 1 micron to 100 microns.

In some embodiments, the carbon black may be integrated into the thermoplastic component. e.g., phenoxy resin, in an amount ranging from 1 wt. % to 15 wt. %. In some embodiments, the carbon black may be integrated into the thermoplastic region. In other embodiments, the carbon black may be integrated into the thermoplastic in an amount of 4 wt. % or less, e.g., ranging from 1 wt. % to 4 wt. %. In other examples, the amount of carbon black filler that may be present in the thermoplastic adhesive, e.g., phenoxy adhesive, may be equal to 1 wt. %, 2 wt. %, 3 wt. %, 4 wt. %, 5 wt. %, 63 wt. %, wt. %, 7 wt. %, 8 wt. %, 9 wt. %, 10 wt. %, 11 wt. %, 12 wt. %, 13 wt. %, 14 wt. %, and 15 wt. %, as well as, be present in any range comprising any of the aforementioned values as a lower limit to the range, and any of the aforementioned values as an upper limit to the range.

In some examples, the carbon black filler is integrated into the thermoplastic component of the adhesive, e.g., phenoxy resin, by dissolving the thermoplastic in a solvent, and mixing the carbon black into the dissolved thermoplastic and solvent mixture using a high speed mixer. The solvent may be one of ketones, glycol ethers and glycol-esters.

Applying the adhesion layer 23 and/or the release layer 24 may be applied to the front side surface of the semiconductor containing device substrate 21 and the semiconductor containing handler substrate 22 using a deposition process, such as spin coating. Typical spin solvents that are suitable for depositing the adhesion layer 23 and/or the release layer 24 using spin coating may include Propylene Glycol Methyl Ether (PGME), Propylene glycol monomethyl ether acetate (PGMEA), ethyl lactate, N-Methyl-2-pyrrolidone (NMP) and combinations thereof. In some embodiments, the spin coating solution may further include cyclohexanone.

Spin coating parameters may depend on the viscosity of the adhesion layer 23 and/or the release layer 24, but may fall in the range from approximately 500 rpm to approximately 3000 rpm. One example of a spin coating apparatus for depositing the adhesion layer 23 and/or the release layer 24 is a fully automated coater system ACS200 from SUSS MicroTec. In one example, a center dispense of the liquid material may be employed followed by a spread spin at 1000 rpm for 10 seconds. After the spread spin, the material was spun off at 1400 rpm for 60 seconds. It is noted that the above described coating process is only one example of a method of depositing the adhesion layer 23 and/or the release layer 24 on either of the semiconductor containing device substrate 21 or the semiconductor containing handler substrate 22, and that other deposition methods may be suitable for applying the adhesion layer 23 and/or the release layer 24. For example, the adhesion layer 23 and/or the release layer 24 may be deposited using spraying, brushing, curtain coating and dip coating.

In some embodiments, following application of the adhesion layer 23 and/or the release layer 24 by spin coating, and prior to the wafer bonding step, the spin coated layer of material may be cured. The soft-bake may fall in the range from approximately 80° C. to approximately 120° C. The temperature of the final cure may fall in the range from 200° C. to 400° C. Higher cure temperatures may be more effective at ensuring thermal stability of the UV ablation layer during standard CMOS BEOL processing which may take place between 350° C. and 400° C. For strongly infra-red (IR)-absorbing or infra-red (IR) sensitive materials, very thin final layers on the order of approximately 1000 Å to approximately 1 micron thick may be sufficient to act as release layers.

Referring to FIG. 1, following application of the adhesive layer 23 and/or the release layer 24, the semiconductor containing device substrate 21 may be bonded to the semiconductor containing handler substrate 22 at step 11, such that the release layer 23 and the adhesive layer 24 are provided between the semiconductor containing device substrate 21 and the semiconductor containing handler substrate 22. The bonding may include a physical bringing together of the semiconductor containing device substrate 21 and the semiconductor containing handler substrate 22 under controlled heat and pressure in a vacuum environment, such as offered in any one of a number of commercial bonding tools.

In some embodiments, to provide bonding, temperature and pressure may applied to the composite of the semiconductor containing handler substrate 22, the adhesion layer 23, the optional release layer 24, and the semiconductor containing device substrate 21. In one embodiment, the bonding temperature may range between 150° C. to 250° C., and the pressure applied may range from 0.07 MPA to 0.22 MPa. In another embodiment, the bonding temperature may range from 175° C. to 200° C., and the pressure may range from 0.15 MPa to 0.22 MPa. The time period at which the bonding temperature and pressure is held may range from 10 minutes to 60 minutes. The bonding step may be performed in a nitrogen atmosphere.

Typically, bonding includes elevating the temperature of the release layer 24 (when present), and the adhesion layer 23, to effectuate curing of the polymer. In some embodiments, when both the adhesive layer 23, and the release layer 24, phenoxy resin adhesive, such as polyoxy(2-hydroxy-1,3 propanediyl)oxy-1,4-phenylene(1-methylethylidene)-1,4-phenylene, has a viscosity ranging from 100-10,000 Pa. seconds when at a temperature ranging from 160° C. to 210° C., and under a pressure of 1000 mbar per area of an 8 inch wafer size for at least one of the device substrate 21 and/or handing substrate 22. The viscosity of the phenoxy resin adhesive is at least one order of magnitude greater than typical adhesives composed of polyimides and/or poly (meth)acrylates. In prior adhesives, such as polyimide and/or poly(meth)acrylates bonding at temperatures below 300° C. resulted in too low a viscosity of the adhesive layer, which resulted in adhesive squeeze out. By providing a higher viscosity with phenoxy resin adhesives, squeeze out of the release layer 23 and/or the adhesive layer 24 during bonding of the semiconductor containing device wafer 21 to the semiconductor containing handler substrate 22 is substantially reduced if not eliminated. In some embodiments, the viscosity of the phenoxy resin including the carbon black filler at temperatures ranging from 160° C. to 210° C. may range from 1,500-10,000 Pa. second. In another embodiment, the viscosity of the phenoxy resin including the carbon black filler at temperatures ranging from 160° C. to 210° C. may range from 2500-10,000 Pa. second. In yet another embodiment, the viscosity of the phenoxy resin including the carbon black filler at temperatures ranging from 160° C. to 210° C. may range from 5000-10,000 Pa. second. In one examples, the viscosity of the phenoxy resin at temperatures ranging from 160° C. to 210° C. may be equal to 100, 200, 300, 400, 500, 600, 700, 800, 900, 1000, 1500, 2000, 2500, 3000, 3500, 4000, 4500, 5000, 5500, 6000, 6500, 7000, 7500, 8000, 8500, 9000, 9500, and 10000 Pa. second, and any range including at least two of the above noted values.

Each of the adhesive layer 24, and the release layer 23 (when present), following bonding to the semiconductor containing handler wafer 22, and the semiconductor containing device substrate 21 may have a shear strength of 40 MPa or greater.

Another advantage of the present methods is that the curing of the phenoxy resin is at temperatures less than the curing temperatures that are required of prior adhesives, such as polyimides and/or poly(meth)acrylates. For example, imidization of polyimides requires temperatures greater than 300° C., which results in damage to the semiconductor containing device substrate 21, such a wafer warpage and/or cracking. Additionally, the high temperatures required of prior adhesives composed of polyimides and/or poly(meth)acrylates may also result in unnecessary out diffusion of the dopants of the semiconductor devices that have been integrated into the semiconductor containing device substrate 21. Bonding with phenoxy resin is at temperatures below 300° C., which is at a temperature that does not damage. i.e., does not cause warping or cracking of the semiconductor containing device substrate 21, and does not cause outdiffusion of the semiconductor device dopants. In one embodiment, the bonding temperature of the phenoxy resin adhesive may range from 150° C. to 290° C. In another embodiment, the bonding temperature of the phenoxy resin adhesive may range from 160° C. to 210° C. In other examples, the bonding temperature of the phenoxy resin may be at 150, 160, 170, 180, 190, 200, 210, 220, 240, 250, 260, 270, 280 and 290° C., as well as any range including two of the aforementioned values.

Referring to FIG. 1, in some embodiments, after bonding to provide the composite of the semiconductor containing handler substrate 21, the adhesion layer 23, the optional release layer 24, and the semiconductor containing handler substrate 22, the desired processing may be performed to the backside surface of the semiconductor containing device substrate 21 at step 12. The backside surface of the semiconductor containing device substrate 21 is not engaged to one of the adhesive layer 23 or the release layer 24. The backside surface of the semiconductor containing device substrate 21 is typically opposite the surface of the semiconductor containing device substrate 21 that the semiconductor devices may be formed on, which may be referred to as the upper surface of the semiconductor containing device substrate 21. For example, backside processing may include such process steps as patterning, etching, thinning, etc. until the device wafer has achieved its desired state.

For example, in one embodiment, the semiconductor containing device substrate 21 may be thinned by applying a planarization process and/or a grinding process to the backside surface of the semiconductor containing device substrate 21. In one example, the planarization and grinding process may be provided by chemical mechanical planarization (CMP). In an alternative embodiment, etch processes may be used to remove material from the back surface of the semiconductor containing device substrate 21. Following thinning of the backside surface of the semiconductor containing device substrate 21, the thinned semiconductor containing device substrate 21 may have a thickness ranging from 5 microns to 100 microns In another embodiment, the thinned semiconductor containing device substrate 21 may have a thickness ranging from 20 microns to 50 microns. In one example, the thinned semiconductor containing device substrate 21 may have a thickness ranging from 5 microns to 10 microns. The semiconductor containing handler substrate 22 supports the semiconductor containing device substrate 21 during the mechanical thinning process to protect the semiconductor containing device substrate 21 from mechanical failure, such as cracking.

In another example, the backside processing of the semiconductor containing device substrate 21 may include a patterning step to form interconnects to the semiconductor devices that are integrated within the semiconductor containing device substrate 21. For example, via interconnects, such as through silica vias (TSV), may be formed to the active regions within the semiconductor containing device substrate 21. Through silica vias (TSV) may be employed to interconnect stacked devices wafers in forming a three dimensional (3D) microelectronic device. Vias can be formed to the active portions of the semiconductor containing device substrate 21, using photoresist deposition, lithographic patterning to form a photoresist etch mask, and etching, e.g., anisotropic etching. Following via formation, via interconnects can formed by depositing a conductive metal into the via holes using deposition methods, such as CVD, sputtering or plating. The conductive metal may include, but is not limited to: tungsten, copper, aluminum, silver, gold and alloys thereof.

After backside processing of the semiconductor containing device substrate 21, a laser ablation process may be performed to sever the semiconductor containing device substrate 21 from the semiconductor containing handler substrate 22 at step 13. During the laser ablation process, a laser emits a wavelength of light that is absorbed by at least one of the release layer 24 (when present), and the adhesive layer 23. To be transmitted through the semiconductor containing handler substrate 22. e.g., silicon (Si) handler substrate, and/or the semiconductor containing device substrate 2,1 to expose at least one of the adhesive layer 23 and a release layer 24 to the wavelengths of light being emitted from the laser at the bonded interface of the semiconductor containing device substrate 21 and the semiconductor containing handler substrate 22, the wavelength of light being emitted from the laser should be within the infra-red (IR) range. Upon exposure to the infra-red (IR) laser light, at least one of the adhesive layer 23 and the release layer 24 may burn, break down, or otherwise decompose. In yet other embodiments, the absorption of the infra-red (IR) wavelengths by at least one of the adhesive layer 23 and the release layer 24 may cause the layer absorbing the infra-red (IR) wavelengths to melt. The burning, break down, melting or otherwise decomposition of at least one the adhesive layer 23 and the release layer 24 is referred to as "ablating" of the material layer with the infra-red (IR) laser.

In one embodiments, infra-red (IR) light is light with a wavelength ranging at a lower limit of the range from ≈700 nm to 800 nm, to a wavelength at an upper limit range, which may be 1 mm. Any laser emitting light within these wavelengths can be referred to as infra-red (IR) laser, and are suitable for ablating at least one of the adhesive layer 23, and the release layer 24, that is present at the bonded interface between the semiconductor containing device substrate 21, and the semiconductor containing handler substrate 22. For example, some laser diodes can emit wavelengths beyond 750 nm. In some embodiments, lasers suitable for laser ablating in accordance with present disclosure include lasers that emit light waves in the near-infrared spectral region (also called IR-A), which may range from ≈700 nm to 1400 nm. In other embodiments, the infra-red (IR) laser for ablating the release layer 24 and the adhesive layer 23 may emit short-wavelength infrared (SWIR, IR-B), which includes light waves extending from 1.4 to 3 µm. In yet other embodiments, the IR laser for ablating the release layer 24 and the adhesive layer 23 may emit mid-infrared (mid-wavelength infrared. MWIR, IR-C), which include wavelengths of light that may range from 3 µm to 8 µm. In yet even further embodiments, the IR laser for ablating the release layer 24 and the adhesive layer 23 may include long-wavelength infrared (LWIR, IR-C) ranges from 8 to 15 µm. In some embodiments, the IR laser for ablating the release layer 24, and the adhesive layer 23, may include long-wavelength infrared (LWIR, IR-C) followed by the far infrared (FIR), which ranges to 1 mm and is sometimes understood to start at 8 µm.

In some embodiments, the laser for ablating at least one of the release layer 24 and the adhesion layer 23 includes Nd:YAG (neodymium-doped yttrium aluminum garnet; $Nd:Y_3Al_5O_{12}$) lasers, helium neon (HeNe) lasers, krypton laser, carbon dioxide ($CO_2$) laser, carbon monoxide (CO) laser or a combination thereof.

Nd:YAG lasers are optically pumped using a flashtube or laser diodes. Nd:YAG lasers typically emit light with a wavelength of 1064 nm, in the infra-red (IR). However, there are also transitions near 940 nm, 1120 nm, 1320 nm. and 1440 nm. Nd:YAG lasers operate in both pulsed and continuous mode. Pulsed Nd:YAG lasers are typically operated in the so-called Q-switching mode. In this Q-switched mode, output powers of 250 megawatts, and pulse durations of 10 to 25 nanoseconds have been achieved. Nd:YAG absorbs mostly in the bands between 730-760 nm and 790-820 nm. The amount of the neodymium dopant in the material varies according to its use. For continuous wave output, the doping is significantly lower than for pulsed lasers. Some common host materials for neodymium are: YLF (yttrium lithium fluoride, 1047 and 1053 nm), $YVO_4$ (yttrium orthovanadate, 1064 nm), and glass. Nd:YAG lasers and variants are pumped either by flashtubes, continuous gas discharge lamps, or near-infrared laser diodes (DPSS lasers).

Helium-neon lasers may emit a wavelength of light ranging from approximately 1.15 µm to approximately 3.4 µm. A helium-neon laser or HeNe laser, is a type of gas laser whose gain medium consists of a mixture of helium and neon (10:1) inside of a small bore capillary tube, usually excited by a DC electrical discharge.

A krypton laser may emit a wavelength of light ranging on the order of 750 nm. A krypton laser is an ion laser, a type of gas laser using krypton ions as a gain medium, pumped by electric discharge.

Carbon dioxide ($CO_2$) lasers can emit light wavelengths at 10.6 µm, and some other wavelengths in that region, e.g., micrometer wavelengths being greater than 9.5 µm. Carbon dioxide ($CO_2$) lasers are gas lasers that are one of the highest-power continuous wave lasers, in which the ratio of output power to pump power can be as large as 20%. The pump source for carbon dioxide ($CO_2$) lasers may be transverse (high power) or longitudinal (low power) electrical discharge.

Carbon monoxide (CO) lasers can emit light wavelengths that in some embodiments can range from 2.6 µm to 4 µm, and in some other embodiments can range from 4.8 µm to 8.3 µm. The pump source for carbon monoxide (CO) lasers may be electrical discharge.

It is noted that the above examples of infra-red (IR) lasers that are suitable for the methods and adhesive compositions disclosed herein is intended to be illustrative, and is not intended to limit the present disclosure, as any number of infra-red (IR) lasers are suitable for use with the methods and adhesives of the present disclosure, so long as the laser emits light wavelengths within the above described infra-red (IR) ranges.

As described above, thermoplastic resin, e.g., phenoxy resin, typically does not absorb wavelengths within the infra-red (IR) range. Black carbon filler is added to the thermoplastic resin. e.g., phenoxy resin, to provide that the phenoxy resin absorbs the infra-red (IR) wavelengths. In this manner, by adding carbon black filler to the thermoplastic polymer, i.e., phenoxy resin, a release layer 24 composed of thermoplastic polymer, e.g., phenoxy resin, including carbon black filler may be provided that when subjected to the wavelengths emitted by the infra-red (IR) laser is ablated, wherein ablating the release layer de-bonds the semiconductor containing device substrate 21 from the semiconductor containing handler substrate 22. In some embodiments, when the adhesion layer 23 also includes a thermoplastic resin, e.g., phenoxy resin, that also includes carbon black filler, the infra-red (IR) laser that ablates the release layer 24 may also ablate the adhesive layer 23. In some embodiments, when the adhesion layer 23 does not absorb infra-red (IR) layer wavelengths, e.g., when the adhesion layer 23 is composed of a thermoplastic resin, such as phenoxy resin, that does not include the carbon black filler, when the infra-red (IR) laser ablates the release layer 24, the adhesive layer 23 may remain hard and engaged to at least one of the semiconductor containing device substrate 21 and the semiconductor containing handler substrate 22. In some embodiments, when the release layer 24 is omitted, and the adhesive layer 23 is composed of a thermoplastic polymer, e.g., phenoxy resin, including carbon black filler, ablating the adhesive layer 23 de-bonds the semiconductor containing device substrate 21 from the semiconductor containing handler substrate 22.

Thus, at least one of the release layer 24 and the adhesive layer 23 according to exemplary embodiments of the present disclosure comprises a material that is broken down under the exposure of the infra-red (IR) laser light. In some embodiments, when the adhesive layer 23 does not include carbon black filler, as the adhesive layer 23 may remain hard during this process, the semiconductor containing device wafer 21, along with the adhesive layer 23, may be easily removed from the semiconductor containing handler substrate. Where desired, the remainder of the adhesive layer 23 that is not ablated by the infra-red (IR) laser may be removed from either of the semiconductor containing device substrate 21 and the semiconductor containing handler substrate 22 using various processing techniques.

Referring to FIG. 1, after the laser ablation has resulted in the severing of the semiconductor containing device substrate 21 from the semiconductor containing handler substrate 22, the semiconductor containing device substrate 21 may be easily removed from the semiconductor containing handler substrate 22, e.g., by simply pulling the semiconductor containing handler substrate 22 away, and the semiconductor containing device substrate 21 may be cleaned to remove the adhesive layer 23, or remaining portion of the adhesive layer 23 at step 14.

In some embodiments, residues of thermoplastic material, e.g., phenoxy resins, that remain on one of the semiconductor containing handler substrate 22, and the semiconductor containing device substrate 21, following removal of the release layer 24 may be accomplished using a solvent selected from the group consisting of gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), and combinations thereof. Additionally, when the adhesive layer 23 is composed of a thermoplastic material, such as phenoxy resin, the adhesive layer 23 may be removed from the semiconductor containing handler substrate 22 and/or the semiconductor containing device substrate 21 using a solvent selected from the group consisting of gamma-butyrolactone, ethyl lactate, other lactate isomers known under the tradename Gavesolv, NMP, Tetrahydrofuran (THF), PMAcetate, Methyl isobutyl ketone (MIBK), Methyl ethyl ketone (MEK), and combinations thereof.

FIG. 2 is a schematic diagram illustrating bonding and de-bonding of a semiconductor containing device substrate 21 to a semiconductor containing handler substrate 22, in accordance with exemplary embodiments of the present disclosure. In some embodiments, the semiconductor containing device substrate 21 may be a silicon substrate that is to be processed, for example, to be added to a three dimensional (3D) stack, such as a layer in a 3D integrated circuit (IC), or an IC to be included in a 3D package. The semiconductor containing device substrate 21 may be processed prior to bonding, however, prior to bonding the semiconductor containing device substrate 21 may be a full-thickness wafer. The semiconductor containing device substrate 21 may be bonded to the semiconductor containing handler substrate 22 to provide structural support thereto during subsequent processing, which may include a thinning of the semiconductor containing device substrate 21 to the point where it may no longer poses the structural integrity necessary to withstand certain processing steps that may have to be performed. The semiconductor containing device substrate 21 need not comprise silicon and may instead comprise an alternative semiconductor material, as described above. The semiconductor containing device substrate 21 may originate as a full-thickness wafer, and may subsequently be thinned down to a size of between approximately 200 µm and 20 µm.

The semiconductor containing handler substrate 22 may also be composed of a semiconductor material, such as silicon containing material. In some embodiments, the silicon including material that provides the semiconductor containing handler substrate 22 may include, but is not limited to silicon, single crystal silicon, multi-crystalline silicon, polycrystalline silicon, amorphous silicon, strained silicon, silicon doped with carbon (Si:C), silicon alloys or any combination thereof. In other embodiments, the semiconductor containing handler substrate 22 may be a semiconducting material that may include, but is not limited to, germanium (Ge), silicon germanium (SiGe), silicon germanium doped with carbon (SiGe:C), germanium alloys, GaAs, InAs, InP as well as other III/V and II/VI compound semiconductors. The semiconductor containing handler substrate 22 may be sufficiently thick to provide structural integrity to the semiconductor containing device substrate 21 bonded thereto. For example, the semiconductor containing handler substrate 22 may be approximately 650 μm thick.

As described above, the adhesive layer 23 and the release layer 24 may be provided between the semiconductor containing device substrate 21 and the semiconductor containing handler substrate 22. According to one exemplary embodiment of the present disclosure, the release layer 24 is disposed directly upon the semiconductor containing handler substrate 22.

The release layer 24 may comprise a material that is highly specialized to absorb strongly near the infra-red (IR) wavelength of laser light used during laser ablation. As exemplary embodiments of the present disclosure may employ an infra-red (IR) laser, for example, emitting light having wavelengths ranging from 700 nm to 1 mm, the release layer 24 may comprise a material highly absorbent of infra-red (IR) light, and in particular, light having a wavelength from 1100 nm to 3000 nm. For example, the release layer 24 may be comprised of a thermoplastic resin, such as a phenoxy resin. The thermoplastic resin of the release layer 24 typically includes carbon filler in a concentration ranging from 1 wt. % to 15 wt. %. The carbon black filler converts the thermoplastic resin, e.g., phenoxy resin, from being a material that does not absorb infra-red (IR) wavelengths to a thermoplastic resin, e.g., phenoxy resin, that absorbs infra-red (IR) wavelengths in a manner that ablates the release layer from the semiconductor containing handler substrate 22. For example, the infra-red (IR) wavelengths emitted by the laser and absorbed by the release layer 24 causes de-bonding primarily through photochemical means, by directly breaking chemical bonds in the release layer 24 of the carbon black filled thermoplastic, e.g., phenoxy resin filled with carbon black.

The adhesive layer 23 is present between the release layer 24 and the semiconductor containing handler substrate 22, and may also have a thermoplastic composition. For example, the adhesive layer 23 may be composed of a phenoxy resin. The phenoxy resin of the adhesive layer 23 also include a filler of carbon black similar to the thermoplastic composition of the release layer 24. Because the release layer 24 is ablated by the infra-red (IR) wavelengths of light emitted by the infra-red (IR) laser to provide the de-bonding performance, in some embodiments it is not necessary that the adhesive layer 23 include the carbon black filler that is employed in the release layer 24 to absorb infra-red wavelengths of light.

In some embodiments, the release layer 24 may be omitted. In this embodiment, the adhesive layer 23 provides the both the adhesive function for bonding the semiconductor containing device substrate 21 to the semiconductor containing handler substrate 22, as well as the de-bonding function of the release layer 24 (which is omitted). In this embodiment, it is required that the thermoplastic resin, e.g., phenoxy resin, of the adhesive layer 23 include a filler of carbon black to provide that the adhesive layer absorbs the infra-red (IR) wavelengths of light being omitted by the infra-red (IR) laser. For example, the carbon black filler may be present in a concentration ranging from 1 wt. % to 15 wt. %.

In some embodiments, the adhesive layer 23 and the release layer 24 may be collectively referred to as at least one bonding layer. As discussed above, the de-bonding method may employ an infra-red (IR) laser 25 that may emit infra-red (IR) wavelengths of light ranging from 700 nm to 1 mm. In some embodiments, the infra-red (IR) laser 25 used in accordance with the present disclosure may have a wavelength ranging from 1000 nm to 5000 nm, a low power level of 100 mJ/cm$^2$ or less, and a pulse rate ranging from 5 khz to 500 khz. It is noted that the above values are illustrative of only one embodiment of the present disclosure, and is not intended to limit the present disclosure to only this example. For example, the pulse of the laser may cover a wide range, so long as the laser when applied does not damage the active circuits contained in the device wafer.

The release layer 24 may be irradiated though the semiconductor containing handler substrate 22, which may not absorb the infra-red (IR) wavelengths of the infra-red (IR) laser 25. The infra-red (IR) laser 25 may produce a spot beam that is scanned across the surface of the semiconductor containing handler substrate 22, for example, in a raster pattern, or the infra-red (IR) laser 25 may produce a fan beam that is swept once or multiple times across the semiconductor containing handler substrate 22. Directing of the light radiated from the infra-red (IR) laser 25 may be handled by the use of a seamier and lens 26.

Figure 3A:
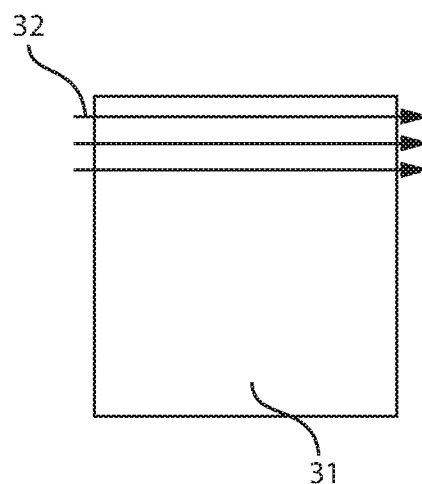
FIGS. 3A and 3B are schematic diagrams illustrating patterns of applying the laser light to a top surface of the semiconductor containing handler substrate in accordance with exemplary embodiments of the present disclosure.
Figure 3B:
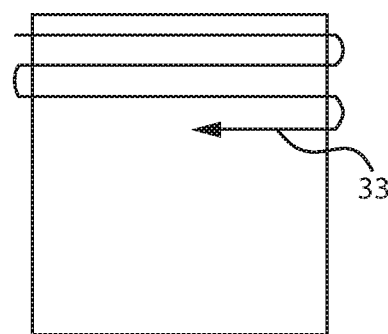

FIGS. 3A and 3B are schematic diagrams illustrating pattern of applying the laser light to a top surface 31 of the semiconductor containing handler substrate 22 in accordance with exemplary embodiments of the present disclosure. As seen in FIG. 3A, the laser light may be directed across the top surface 31 of the semiconductor containing handler substrate 22 as a spot beam drawn to lines 32 which move along an x-axis direction of the top surface 31 of the semiconductor containing handler substrate 22 with each successive line 32 being drawn lower in the y-axis direction. Alternatively, as seen in FIG. 3B, the laser light may be directed in a serpentine pattern 33.

Figure 4:
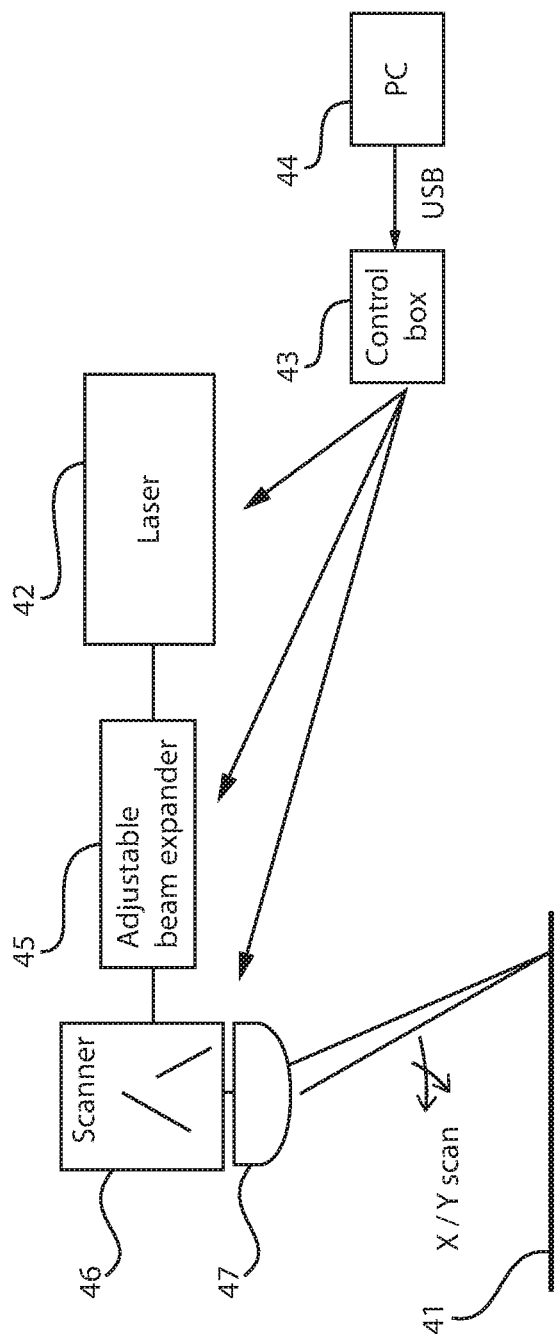
FIG. 4 is a schematic diagram illustrating a scanning laser de-bonding system in accordance with exemplary embodiments of the present disclosure.

FIG. 4 is a schematic diagram illustrating an apparatus for performing laser de-bonding in accordance with exemplary embodiments of the present disclosure. According to some exemplary embodiments of the present disclosure, such as is shown here in FIG. 4, the bonded semiconductor containing handler substrate and semiconductor containing device substrate 41 may remain stationary, e.g., on a stage. According to other exemplary embodiments, the stage may be movable. The infra-red (IR) laser 42 may provide a beam that may then be sent into a beam expander 45 to provide the desired beam size. The beam may then enter a scanner 46 where the beam can be directed along the x and y axes. One or more control units 43 may affect control of the infra-red (IR) laser 42, beam expander 45 and the scanner 46. Where the stage upon which the bonded handler and wafer 41 are held is movable, the controller 43 may control the movement of the stage as well. In such a case the scanner 46 may be omitted. A computer system 44 may be preprogrammed with the manner of control and these instructions may be executed though the one or more control units 43. A scan lens 47 may adjust the beam so as to strike the bonded handler and device wafer 41 with the desired spot characteristics.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The following examples are provided to further illustrate the present disclosure and demonstrate some advantages that arise therefrom. It is not intended that the disclosure be limited to the specific examples disclosed.

Having described preferred embodiments of a system and method for employing a thermoplastic temporary adhesive for silicon handler substrate with infra-red laser wafer bonding, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A bonding material comprising:
a phenoxy resin thermoplastic binder; and
a carbon black filler component, wherein the carbon black filler converts the phenoxy resin thermoplastic component from a material that transmits infra-red (IR) wavelengths to a material that absorbs a portion of infra-red (IR) wavelengths, wherein the carbon black is comprised of agglomerates of carbon particles having a diameter ranging from 15 nm to 300 nm, the agglomerates have a size ranging from 1 micron to 100 microns, the bonding material being present between two semiconductor wafers, wherein viscosity of the bonding material at temperatures ranging from 160° C. to 210° C. ranges from 5000 Pa·s to 10,000 Pa·s.

2. The bonding material of claim 1, wherein the bonding material provides an adhesive layer for wafer bonding or a release layer for wafer de-bonding.

3. The bonding material of claim 1, wherein the IR wavelengths absorbed range from 700 nm to 1 mm.

4. The bonding material of claim 1, wherein the phenoxy resin is a linear polymer of epichlorohydrin and bisphenol A.

5. The bonding material of claim 1, wherein the phenoxy resin has a molecular weight range of 10,000 g/mole to 50,000 g/mole.

6. The bonding material of claim 1, wherein the carbon black filler is present in amounts as great as 15 wt %.

7. The bonding material of claim 1, wherein the carbon black comprises an aciniform particulate.

8. A bonding material comprising:
a phenoxy resin thermoplastic binder; and
a carbon black filler component, wherein the carbon black filler converts the phenoxy resin thermoplastic component from a material that transmits infra-red (IR) wavelengths to a material that absorbs a portion of infra-red (IR) wavelengths, wherein the carbon black is comprised of agglomerates of carbon particles having a diameter ranging from 15 nm to 300 nm, the agglomerates have a size ranging from 1 micron to 100 microns, wherein viscosity of the bonding material at temperatures ranging from 160° C. to 210° C. ranges from 5000 Pa·s to 10,000 Pa·s, the bonding material being present between two semiconductor wafers, wherein the phenoxy resin thermoplastic binder comprises polyoxy(2-hydroxy-1,3-propanediyl)oxy-1,4-phenylene(1-methylethylidene)-1,4-phenylene.

9. The bonding material of claim 8, wherein the bonding material provides an adhesive layer for wafer bonding or a release layer for wafer de-bonding.

10. The bonding material of claim 8, wherein the IR wavelengths absorbed range from 700 nm to 1 mm.

11. The bonding material of claim 8, wherein the phenoxy resin has a molecular weight ranging of 10,000 g/mole to 50,000 g/mole.

12. The bonding material of claim 8, wherein the carbon black filler is present in amounts as great as 15 wt %.

13. The bonding material of claim 8, wherein the carbon black comprises an aciniform particulate.

* * * * *